United States Patent
Smythe et al.

(10) Patent No.: US 8,034,655 B2
(45) Date of Patent: Oct. 11, 2011

(54) NON-VOLATILE RESISTIVE OXIDE MEMORY CELLS, NON-VOLATILE RESISTIVE OXIDE MEMORY ARRAYS, AND METHODS OF FORMING NON-VOLATILE RESISTIVE OXIDE MEMORY CELLS AND MEMORY ARRAYS

(75) Inventors: John Smythe, Boise, ID (US); Bhaskar Srinivasan, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 296 days.

(21) Appl. No.: 12/099,267

(22) Filed: Apr. 8, 2008

(65) Prior Publication Data
US 2009/0250681 A1    Oct. 8, 2009

(51) Int. Cl.
*H01L 21/8239*   (2006.01)
(52) U.S. Cl. ........ 438/104; 438/478; 438/479; 438/466; 257/4; 257/489; 257/E21.495
(58) Field of Classification Search .................. 438/104, 438/478, 466, 102
See application file for complete search history.

(56) References Cited

U.S. PATENT DOCUMENTS

| | | | |
|---|---|---|---|
| 4,964,080 A | 10/1990 | Tzeng | |
| 5,049,970 A | 9/1991 | Tanaka et al. | |
| 5,122,476 A | 6/1992 | Fazan et al. | |
| 6,552,952 B2 | 4/2003 | Pascucci | |
| 6,693,821 B2 | 2/2004 | Hsu et al. | |
| 6,693,846 B2 | 2/2004 | Fibranz | |
| 6,753,561 B1 | 6/2004 | Rinerson et al. | |
| 6,753,562 B1 | 6/2004 | Hsu et al. | |
| 6,778,421 B2 | 8/2004 | Tran | |
| 6,785,159 B2 | 8/2004 | Tuttle | |
| 6,806,531 B1 | 10/2004 | Chen et al. | |
| 6,834,008 B2 | 12/2004 | Rinerson et al. | |
| 6,905,937 B2 | 6/2005 | Hsu et al. | |
| 6,930,324 B2 | 8/2005 | Kowalski et al. | |
| 6,940,113 B2 | 9/2005 | Hsu et al. | |

(Continued)

FOREIGN PATENT DOCUMENTS
CN    101005113    12/2006
(Continued)

OTHER PUBLICATIONS
U.S. Appl. No. 12/114,096, filed May 2, 2008, Srinivasan et al.
(Continued)

*Primary Examiner* — Fernando L Toledo
*Assistant Examiner* — Mamadou Diallo
(74) *Attorney, Agent, or Firm* — Wells St. John P.S.

(57) ABSTRACT

A method of forming a non-volatile resistive oxide memory cell includes forming a first conductive electrode of the memory cell as part of a substrate. Insulative material is deposited over the first electrode. An opening is formed into the insulative material over the first electrode. The opening includes sidewalls and a base. The opening sidewalls and base are lined with a multi-resistive state layer comprising multi-resistive state metal oxide-comprising material which less than fills the opening. A second conductive electrode of the memory cell is formed within the opening laterally inward of the multi-resistive state layer lining the sidewalls and elevationally over the multi-resistive state layer lining the base. Other aspects and implementations are contemplated.

17 Claims, 11 Drawing Sheets

U.S. PATENT DOCUMENTS

| | | |
|---|---|---|
| 6,946,702 B2 | 9/2005 | Jang |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 7,002,197 B2 | 2/2006 | Perner et al. |
| 7,005,350 B2 | 2/2006 | Walker et al. |
| 7,009,278 B2 | 3/2006 | Hsu |
| 7,050,316 B1 | 5/2006 | Lin et al. |
| 7,067,862 B2 | 6/2006 | Rinerson et al. |
| 7,085,167 B2 | 8/2006 | Lee et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,323,349 B2 | 1/2008 | Hsu et al. |
| 7,388,775 B2 | 6/2008 | Bedeschi et al. |
| 7,405,967 B2 | 7/2008 | Kozicki et al. |
| 7,557,424 B2 | 7/2009 | Wong et al. |
| 7,570,511 B2 | 8/2009 | Cho et al. |
| 7,639,523 B2 | 12/2009 | Celinska et al. |
| 7,687,793 B2 | 3/2010 | Harshfield et al. |
| 7,696,077 B2 | 4/2010 | Liu |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 2002/0018355 A1 | 2/2002 | Johnson et al. |
| 2002/0196695 A1 | 12/2002 | Pascucci |
| 2003/0218929 A1 | 11/2003 | Fibranz |
| 2004/0002186 A1 | 1/2004 | Vyvoda et al. |
| 2004/0108528 A1 | 6/2004 | Hsu et al. |
| 2004/0124407 A1 | 7/2004 | Kozicki et al. |
| 2004/0245547 A1 | 12/2004 | Stipe |
| 2005/0032100 A1 | 2/2005 | Heath et al. |
| 2005/0205943 A1 | 9/2005 | Yamada |
| 2005/0250281 A1 | 11/2005 | Ufert et al. |
| 2005/0269646 A1 | 12/2005 | Yamada |
| 2005/0287741 A1 | 12/2005 | Ding |
| 2006/0035451 A1 | 2/2006 | Hsu |
| 2006/0062049 A1 | 3/2006 | Lee et al. |
| 2006/0099813 A1 | 5/2006 | Pan et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0284242 A1 | 12/2006 | Jo |
| 2007/0010082 A1 | 1/2007 | Pinnow et al. |
| 2007/0015330 A1 | 1/2007 | Li et al. |
| 2007/0045615 A1 | 3/2007 | Cho et al. |
| 2007/0048990 A1 | 3/2007 | Zhuang et al. |
| 2007/0109835 A1 | 5/2007 | Hsu |
| 2007/0121369 A1 | 5/2007 | Happ |
| 2007/0132049 A1 | 6/2007 | Stipe |
| 2007/0165434 A1 | 7/2007 | Lee et al. |
| 2007/0167008 A1 | 7/2007 | Hsu et al. |
| 2007/0173019 A1 | 7/2007 | Ho et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0268739 A1 | 11/2007 | Yoo et al. |
| 2007/0285965 A1 | 12/2007 | Toda et al. |
| 2007/0295950 A1 | 12/2007 | Cho et al. |
| 2008/0012064 A1 | 1/2008 | Park et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0048165 A1 | 2/2008 | Miyazawa |
| 2008/0049487 A1 | 2/2008 | Yoshimura et al. |
| 2008/0073635 A1 | 3/2008 | Kiyotoshi et al. |
| 2008/0080229 A1 | 4/2008 | Choi et al. |
| 2008/0102278 A1 | 5/2008 | Kreupl et al. |
| 2008/0157257 A1 | 7/2008 | Bertin et al. |
| 2008/0175031 A1 | 7/2008 | Park et al. |
| 2008/0185571 A1 | 8/2008 | Happ et al. |
| 2008/0232160 A1 | 9/2008 | Gopalakrishnan |
| 2008/0247219 A1* | 10/2008 | Choi et al. ................ 365/148 |
| 2009/0014706 A1 | 1/2009 | Lung |
| 2009/0014707 A1 | 1/2009 | Lu et al. |
| 2009/0085121 A1 | 4/2009 | Park et al. |
| 2009/0250681 A1 | 10/2009 | Smythe et al. |
| 2009/0267047 A1 | 10/2009 | Sasago et al. |
| 2009/0268532 A1 | 10/2009 | De Ambroggi et al. |
| 2009/0272960 A1 | 11/2009 | Srinivasan et al. |
| 2009/0316467 A1 | 12/2009 | Liu |
| 2009/0317540 A1 | 12/2009 | Sandhu et al. |
| 2010/0003782 A1 | 1/2010 | Sinha et al. |
| 2010/0065836 A1 | 3/2010 | Lee |
| 2010/0110759 A1 | 5/2010 | Jin et al. |
| 2010/0135061 A1 | 6/2010 | Li et al. |
| 2010/0163829 A1 | 7/2010 | Wang et al. |
| 2010/0193758 A1 | 8/2010 | Tian et al. |
| 2010/0193761 A1 | 8/2010 | Amin et al. |
| 2010/0193762 A1 | 8/2010 | Hsieh et al. |
| 2010/0232200 A1 | 9/2010 | Shepard |

FOREIGN PATENT DOCUMENTS

| | | |
|---|---|---|
| CN | 101051670 | 4/2007 |
| CN | 101034732 | 9/2007 |
| EP | 1796103 | 9/2006 |
| JP | 2005175457 | 6/2005 |
| JP | 2006040981 | 2/2006 |
| JP | 2006-121044 | 5/2006 |
| JP | 2006121044 | 5/2006 |
| KR | 1020060087882 | 8/2006 |
| KR | 20070111840 | 11/2007 |
| KR | 20070118865 | 12/2007 |
| WO | WO 2006/003620 | 1/2006 |
| WO | PCT/US2008/084422 | 3/2009 |
| WO | WO 2009/127187 | 10/2009 |
| WO | WO 2010/068221 | 6/2010 |
| WO | PCT/US2008/084422 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |

OTHER PUBLICATIONS

U.S. Appl. No. 12/141,559, filed Jun. 18, 2008, Sandhu et al.

U.S. Appl. No. 12/166,604, filed Jul. 2, 2008, Sinha et al.

Baek et al., "Multi-layer Cross-point Binary Oxide Resistive Memory (OxRRAM) for Post-NAND Storage Application", IEEE, 2005.

Chen et al., "Perovskite RRAM Devices with Metal/Insulator/PCMO/Metal Heterostructures", IEEE, 2005, pp. 125-128.

Courtade et al., "Microstructure and resistance switching in NiO binary oxide films obtained from Ni oxidation", IEEE, 2006, pp. 94-99.

Ho et al., "A Highly Reliable Self-Aligned Graded Oxide WOx Resistance Memory: Conduction Mechanisms and Reliability", 2007 Symposium on VLSI Technology Digest of Technical Papers, pp. 228-229.

Karg et al., "Nanoscale REsistive Memory Device Using SrTiO3 Films", IEEE, 2007, pp. 68-70.

Lee et al., "2-stack 1D-1R Cross-point Structure with Oxide Diodes as Switch Elements for High Density Resistance RAM Applications", IEEE, 2007 pp. 771-774.

Lin et al., "Effect of Top Electrode Material on Resistive Switching Properties of ZrO2 Film Memory Devices", IEEE, May 2007, vol. 28, No. 5, pp. 366-368.

Miyashita et al., "A Novel Bit-Line Process using Poly-Si Masked Dual-Damascene (PMDD) for 0.13 um DRAMs and Beyond", IEEE, 2000, pp. 15.4.1-15.4.4.

Muller et al., "Emerging Non-Volatile Memory Technologies", IEEE, 2003, pp. 37-44.

Pein et al., "Performance of the3-D Pencil Flash EPROM Cell and Memory Array", IEEE, 1995, pp. 1982-1991.
Yu et al., "Structure Effects on Resistive Switching of Al/TiOx/Al Devices for RRAM Applications", IEEE, 2008, pp. 331-333.
U.S. Appl. No. 12/959,015, filed Dec. 2, 2010, Liu.
U.S. Appl. No. 12/979,189, filed Dec. 27, 2010, Sills et al.
U.S. Appl. No. 13/010,048, filed Jan. 20, 2011, Liu et al.
U.S. Appl. No. 12/701,885, filed Feb. 8, 2010, Sandhu et al.
U.S. Appl. No. 12/765,598, filed Apr. 22, 2010, Sandhu et al.
U.S. Appl. No. 12/765,606, filed Apr. 22, 2010, Tang et al.
Bedeschi et al., "A Bipolar-Selected Phase Change Memory Featuring Multi-Level Cell Storage", IEEE, vol. 44, No. 1, Jan. 2009, pp. 217-227.
Chen et al., "Non-Volatile Resistive Switching for Advanced Memory Applications", IEEE, 2005, 4 pages.
Choi et al., "Defect Structure and Electrical Properties of Single-Crystal Ba0.03SR0.97TiO3", J. Am. Ceram. Soc., 71, [4], pp. 201-205, 1988.
Hosoi et alk., "High Speed Unipolar Switching Resistance RAM (RRAM) Technology", Advanced Materials Res. Lab., Japan; Correlated Electron Res. Center (CERC), Japan; Nanotechnology Res. INst. (NRI), Japan, 4 pages.
http://en.wikipedia.org/wiki/Programmable_metallization_cell.
Hudgens et al., "Overview of Phase-Change Chalcogenide Nonvolatile Memory Technology" MRS Bulletin, Nov. 2004, pp. 829-832.
Ignatiev et al., "Resistance Non-volatile Memory-RRAM", Mater. Res. Soc. Symp. Proc., vol. 997, 2007, Materials Research Society, 9 pages.
Kau et al., "A Stackable cross point phase change memory", IEEE, 2009, pp. 27.1.1-27.1.4.
Komori et al., Disturbless flass memory due to high boost efficiency on BiCS structure and optimal memory film stack for ultra high density storage device; Dec. 2008; pp. 851-854.
Kozicki et al., "Non-Volatile Memory Based on Solid Electrolytes" Center for Solid State Electronics Research, Arizona State University, 8 pagesp.
Kozicki, "Memory Devices Based on Solid Electrolytes" Mater. Res. Soc. Symp. Proc. vol. 997, 2007, Materials Research Society, 10 pages.
Lee et al., "Resistance Switching of Al doped ZnO for Non Volatile Memory Applications", Dept of Materials Science and Engineering, Gwangju Institute of Science and Technology, 2 pages.
Meyer et al., "Oxide Dual-Layer Memory Element for Scalable Non-volatile cross-point Memory Technology", IEEE, 2008, 5 pages.
Oh, "Full Integration of Hihgly Manufacturable 512Mb PRAM based on 90nm Technology", 2006, IEEE, 4 pages.
Pellizzer et al., "A 90nm Phase Change Memory Technology for Stand-Alone Non-Volatile Memory Applications", IEEE, 2006, Symposium on VLSI Technology Digest of Technical Papers, 2 pages. Abstract Only.
Pirovano et al., "Self-Aligned u Trench Phase-Change Memory Cell Architecture for 90nm Technology and Beyond", IEEE, 2007, pp. 222-225. Abstract Only.
Wuttig, "Towards a Universal Memory?" Nature Materials, vol. 4, Apr. 2005, pp. 265-266.
Yoon et al., "Vertical cross-point Resistance Change Memory for Ultra-High Density Non-volatile Memory applications", 2009 Symposium on VLSI Technology Digest of Technical Papers, pp. 26-27.

* cited by examiner

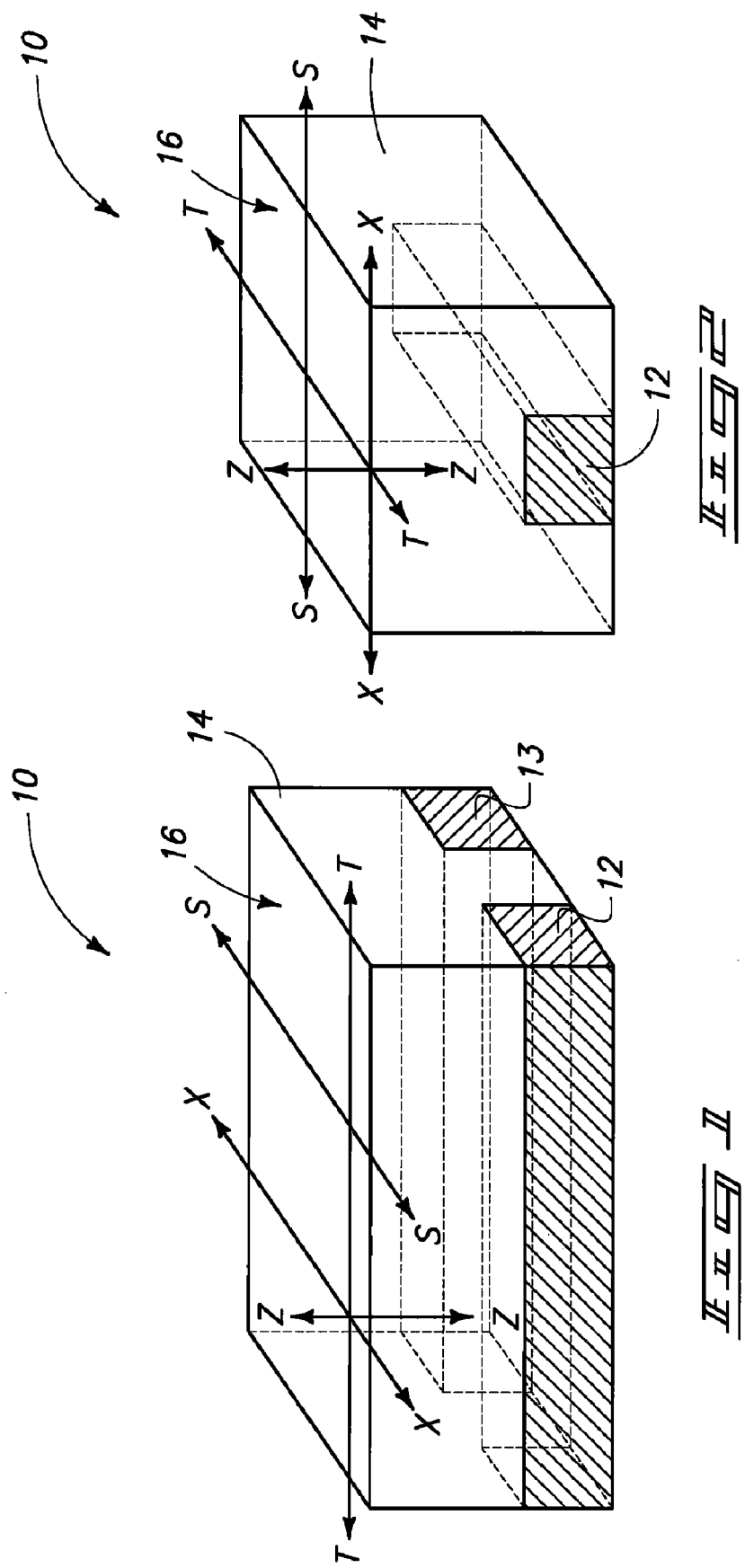

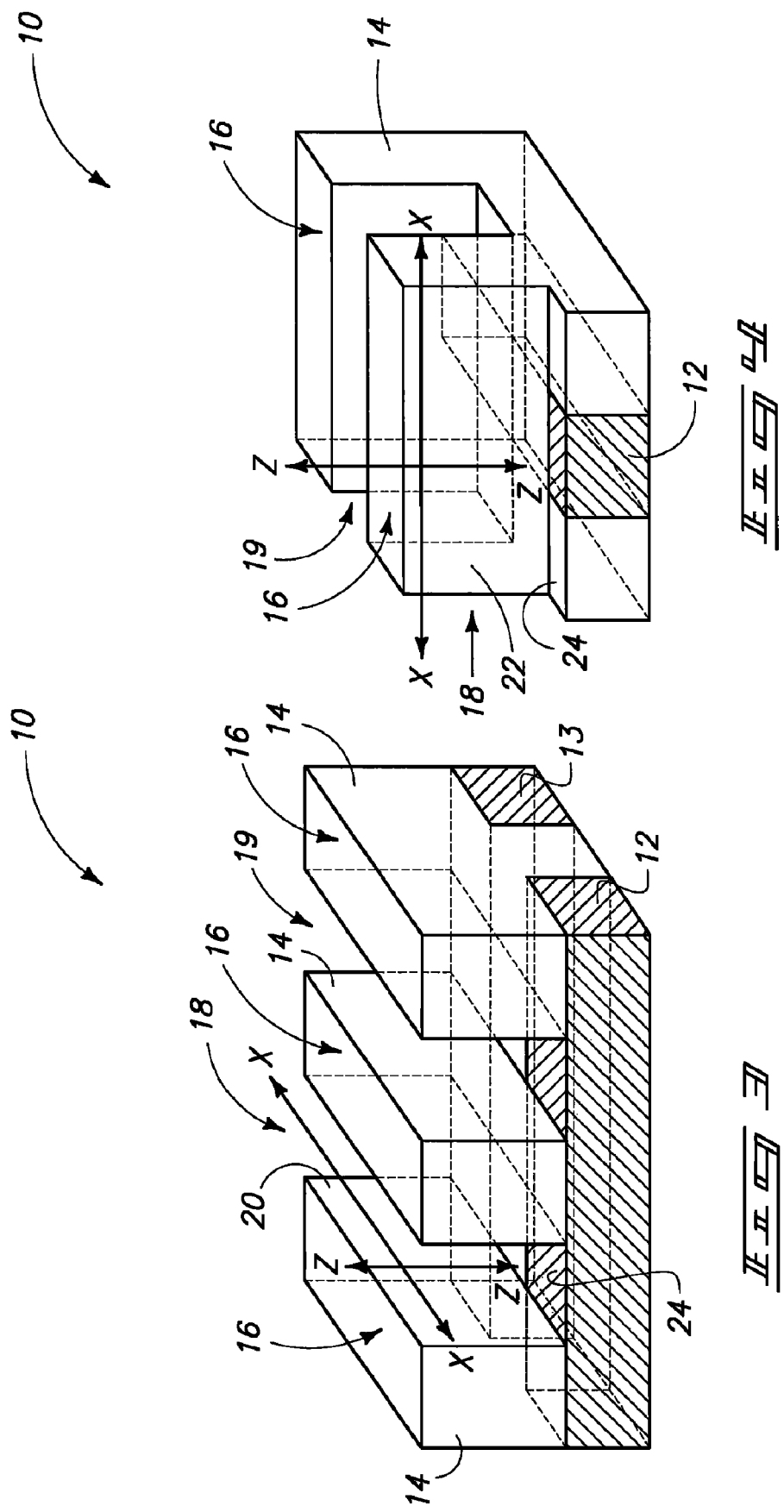

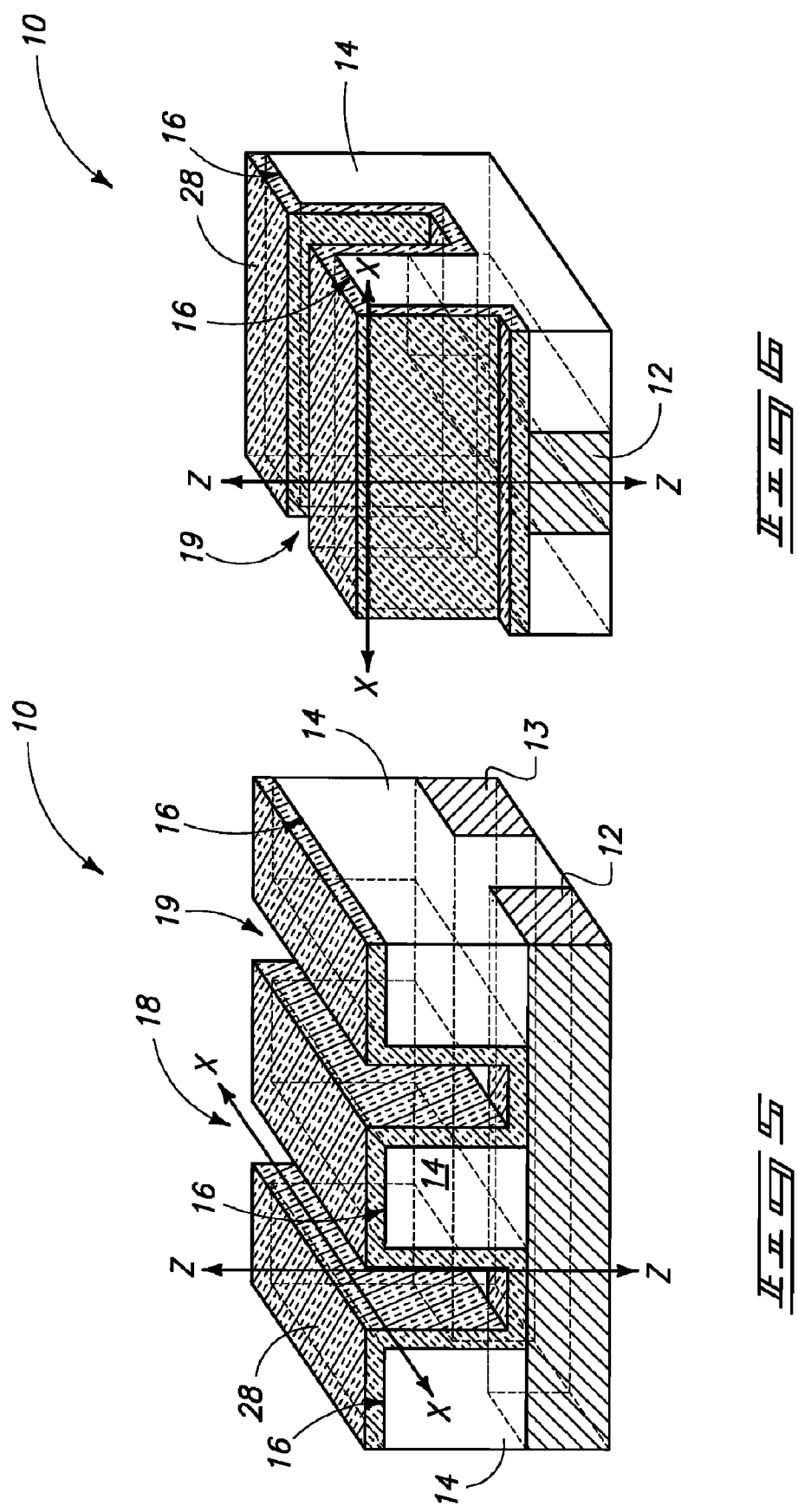

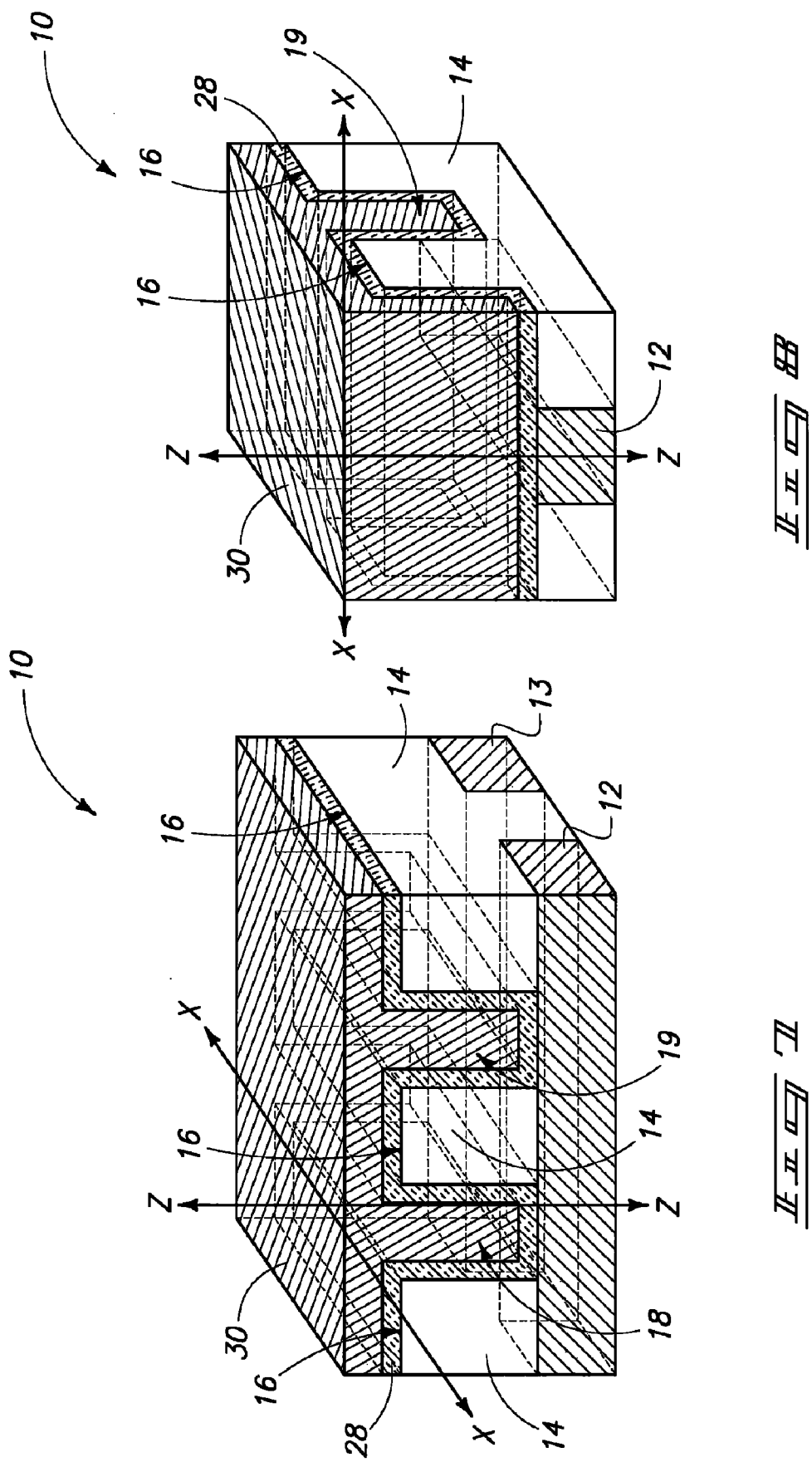

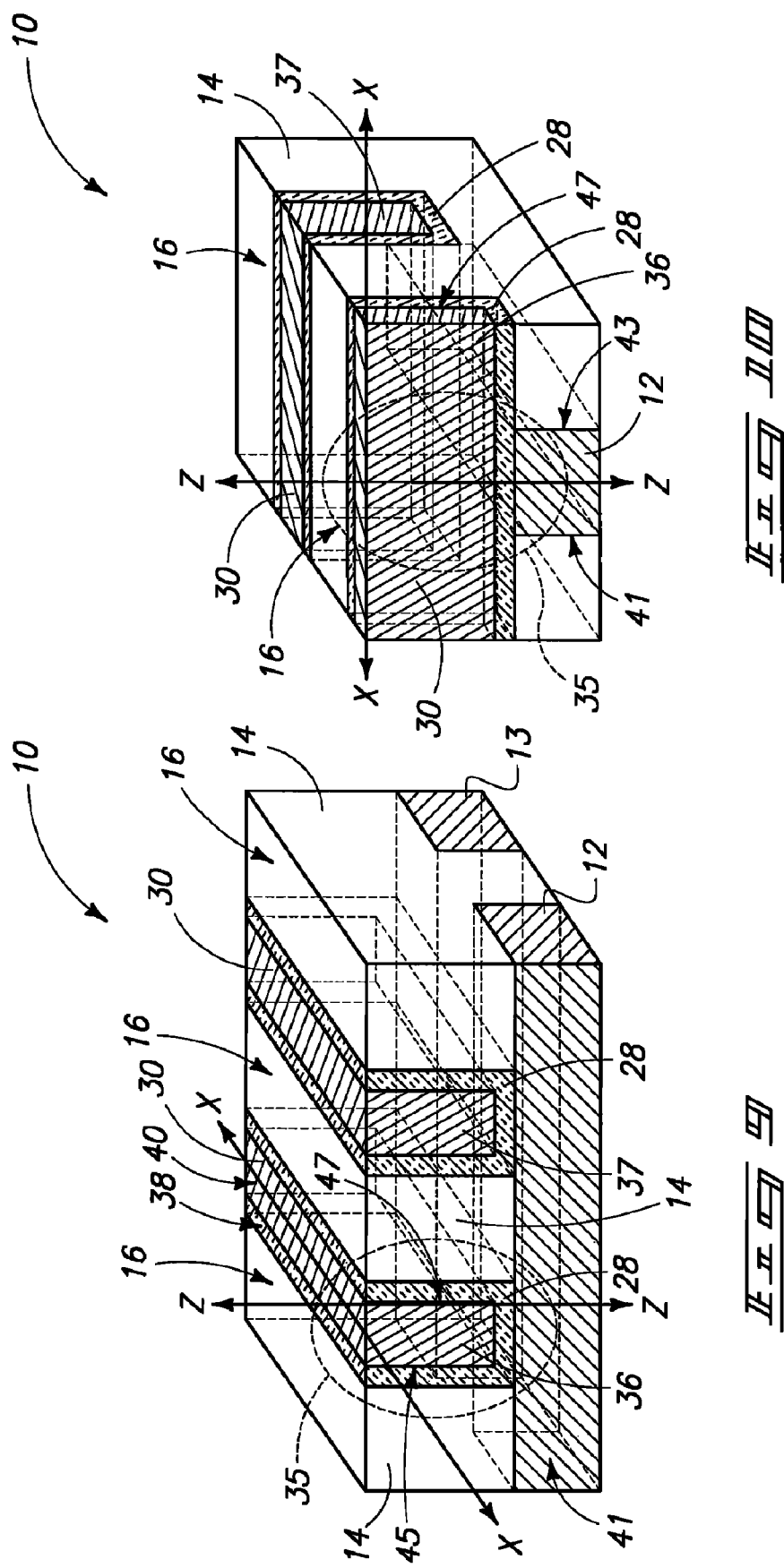

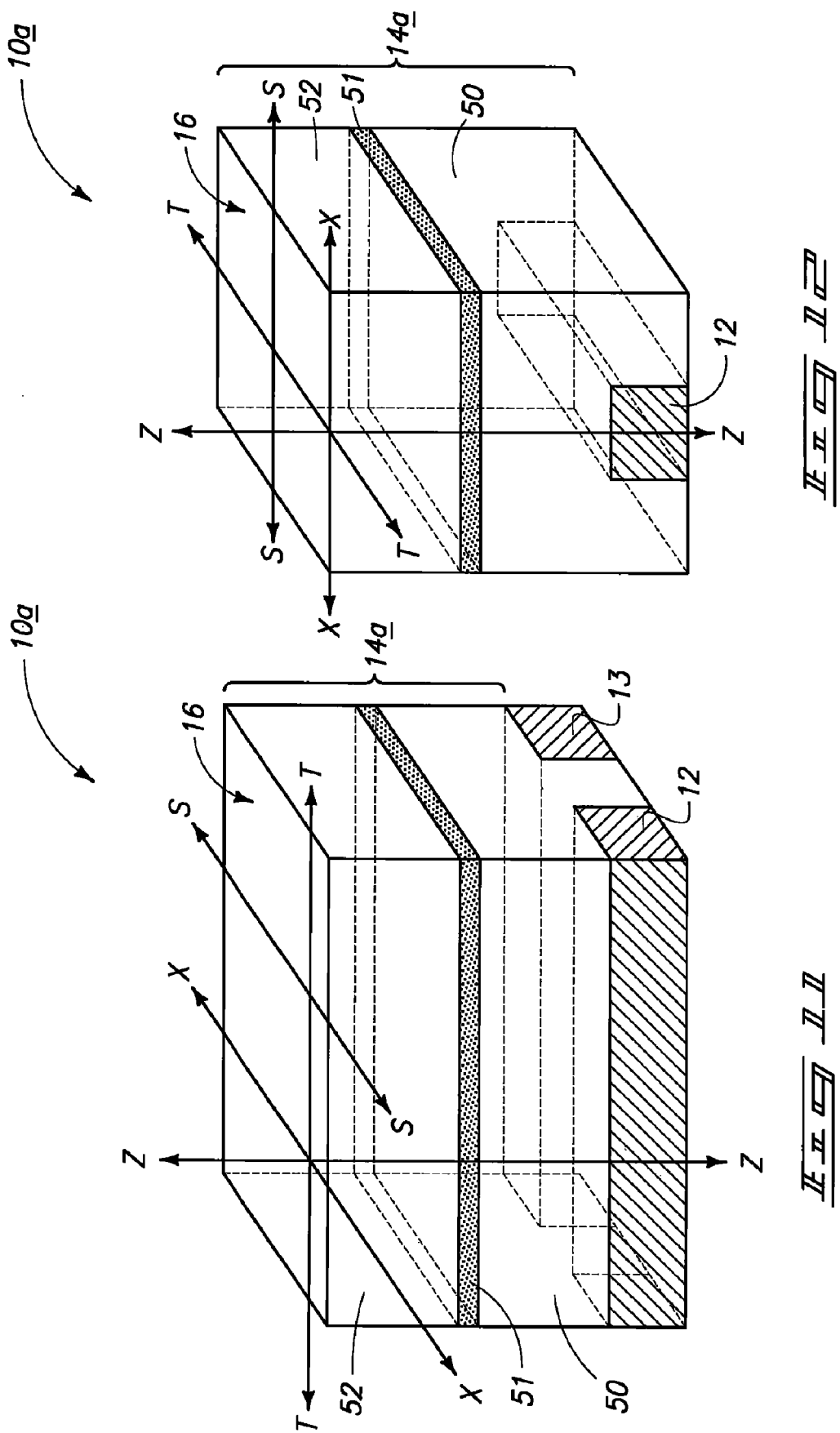

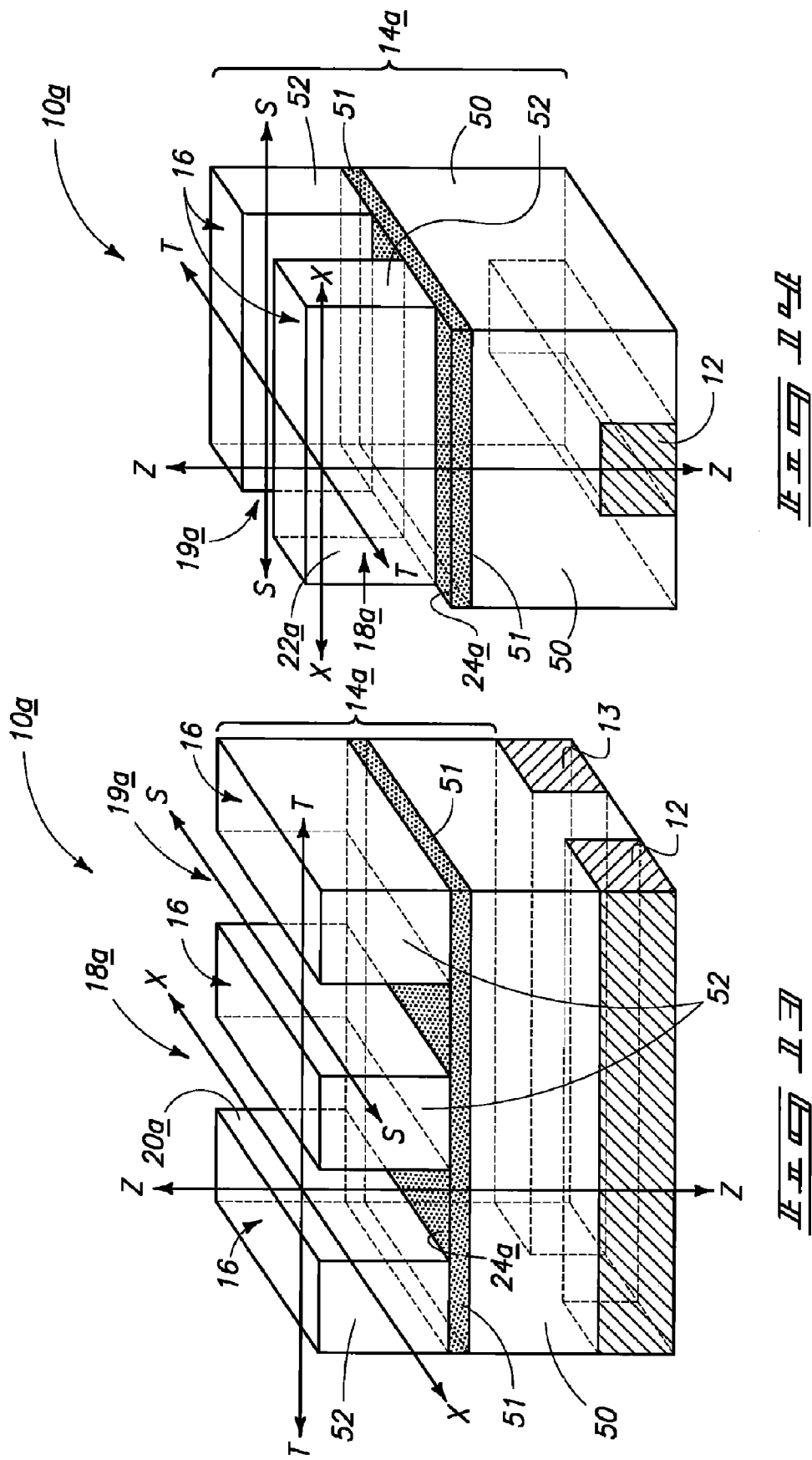

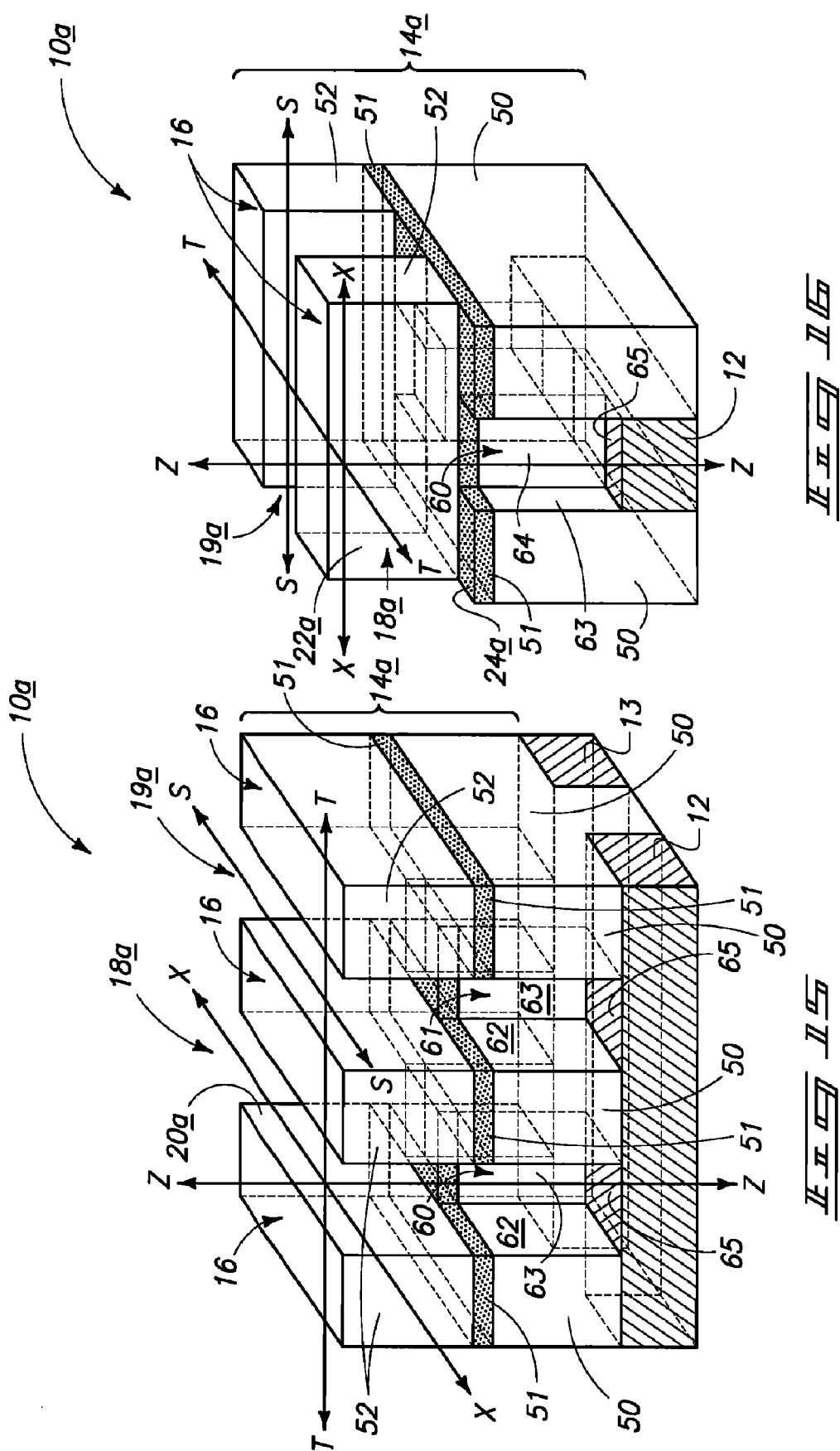

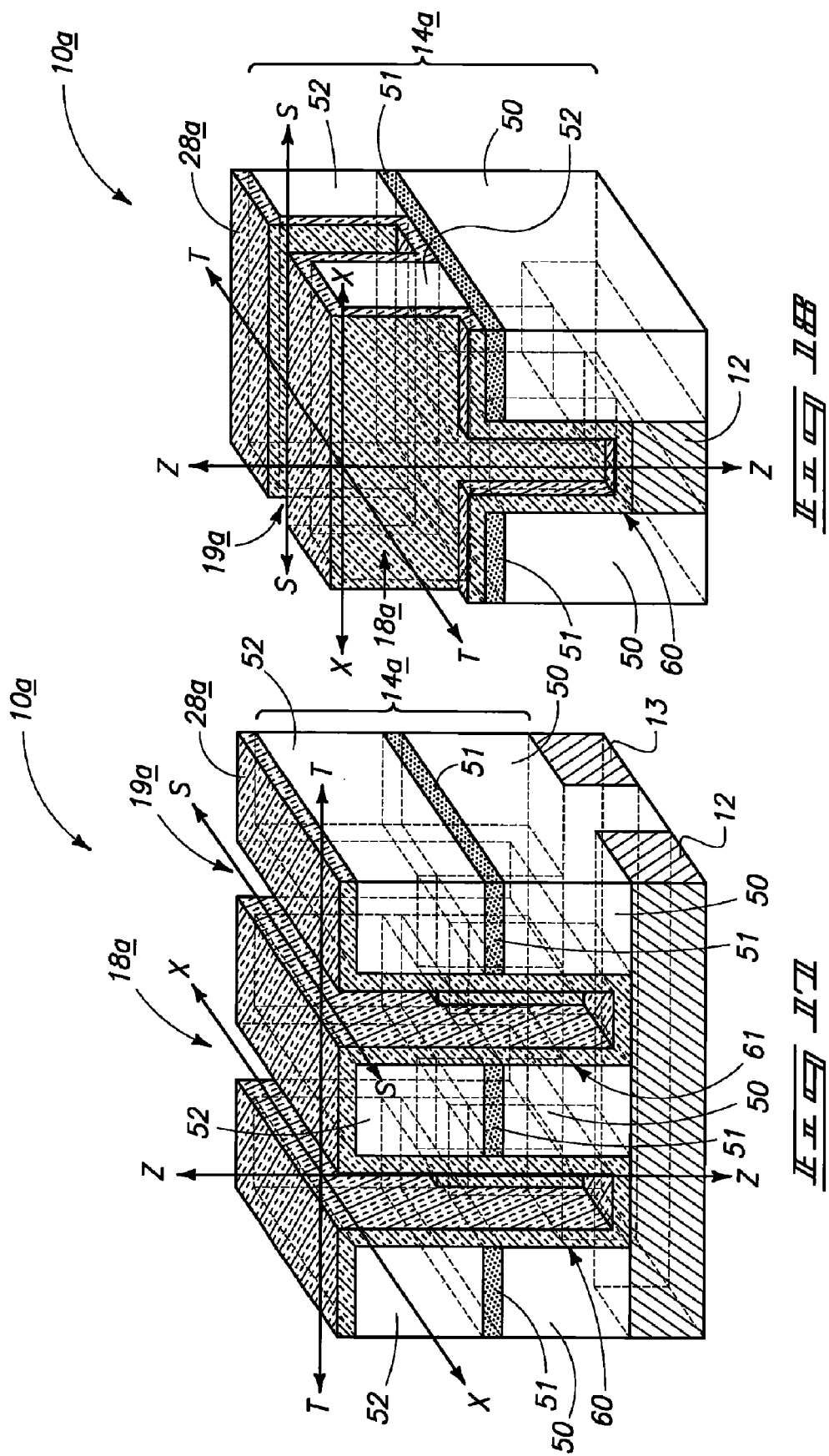

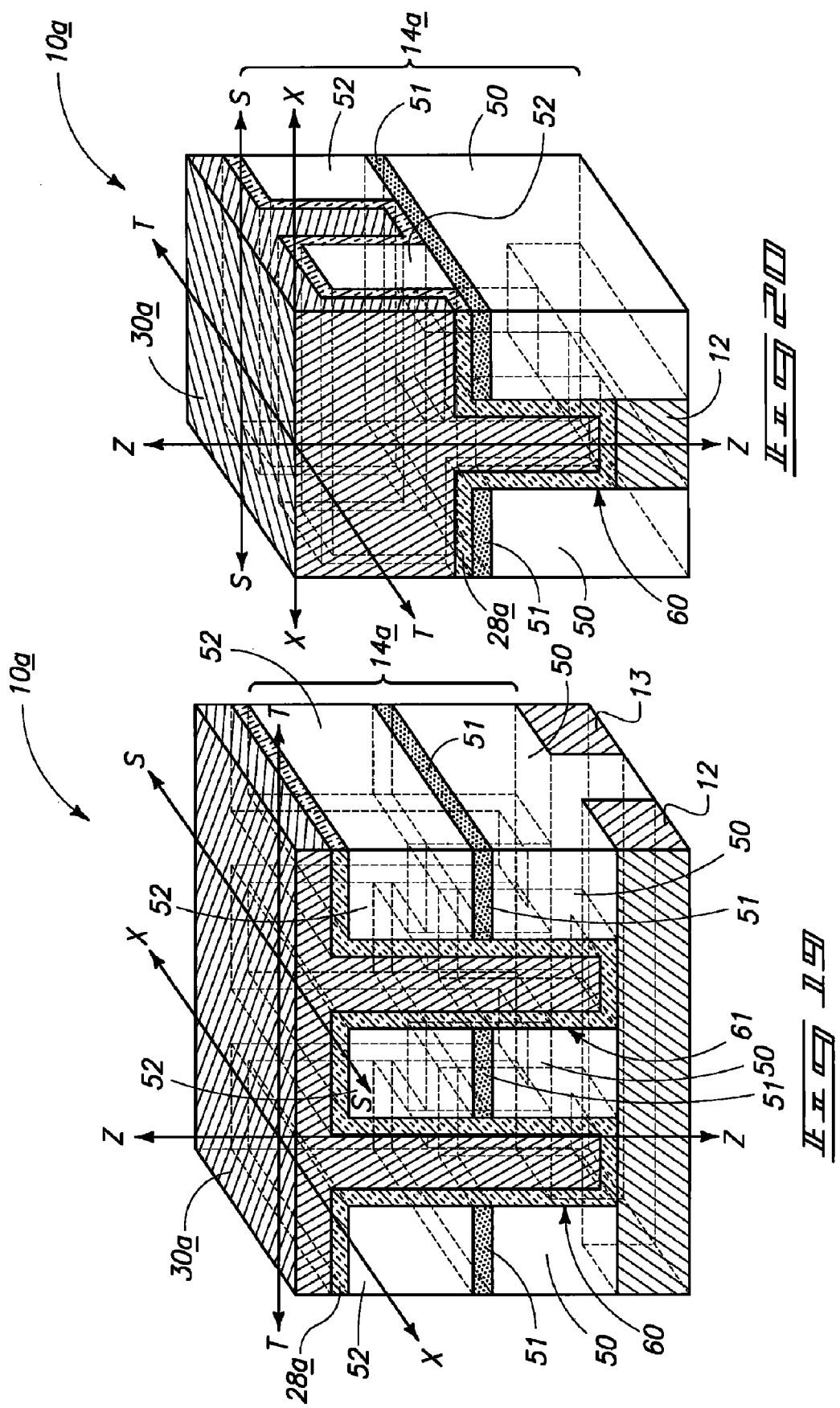

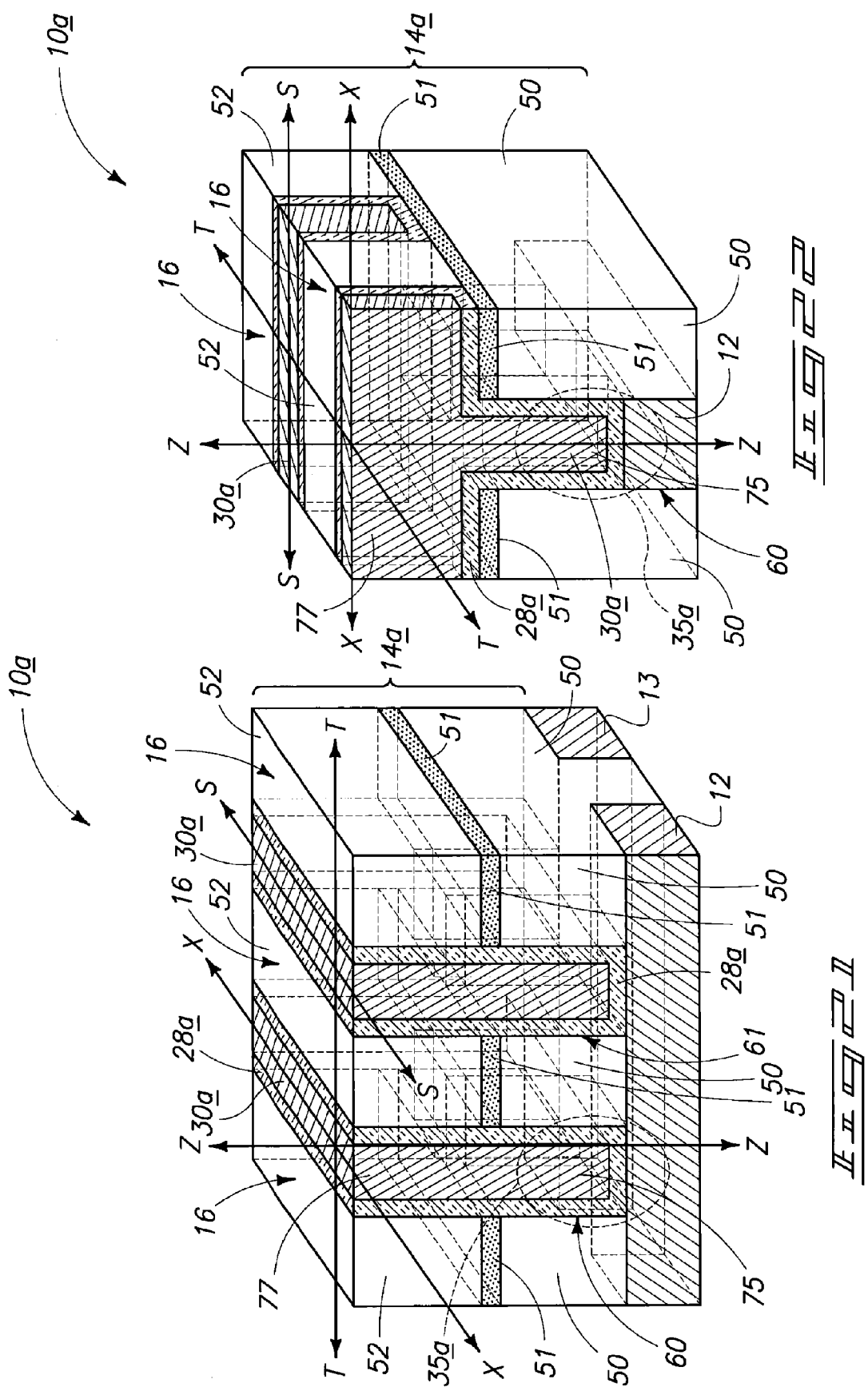

NON-VOLATILE RESISTIVE OXIDE MEMORY CELLS, NON-VOLATILE RESISTIVE OXIDE MEMORY ARRAYS, AND METHODS OF FORMING NON-VOLATILE RESISTIVE OXIDE MEMORY CELLS AND MEMORY ARRAYS

TECHNICAL FIELD

Embodiments disclosed herein pertain to non-volatile resistive oxide memory cells, to non-volatile resistive oxide memory arrays, and to methods of forming non-volatile resistive oxide memory cells and memory arrays.

BACKGROUND

Memory is one type of integrated circuitry, and is used in computer systems for storing data. Such is typically fabricated in one or more arrays of individual memory cells. The memory cells might be volatile, semi-volatile, or non-volatile. Non-volatile memory cells can store data for extended periods of time, and in many instances including when the computer is turned off. Volatile memory dissipates and therefore requires to be refreshed/rewritten, and in many instances including multiple times per second. Regardless, the smallest unit in each array is termed as a memory cell and is configured to retain or store memory in an least two different selectable states. In a binary system, the storage conditions are considered as either a "0" or a "1". Further, some individual memory cells can be configured to store more than two bits of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two conductive electrodes having a programmable material received there-between. Example materials include metal oxides which may or may not be homogenous, and may or may not contain other materials therewith. Regardless, the collective material received between the two electrodes is selected or designed to be configured in a selected one of at least two different resistive states to enable storing of information by an individual memory cell. When configured in one extreme of the resistive states, the material may have a high resistance to electrical current. In contrast in the other extreme, when configured in another resistive state, the material may have a low resistance to electrical current. Existing and yet-to-be developed memory cells might also be configured to have one or more additional possible stable resistive states in between a highest and a lowest resistance state. Regardless, the resistive state in which the programmable material is configured may be changed using electrical signals. For example, if the material is in a high-resistance state, the material may be configured to be in a low resistance state by applying a voltage across the material.

The programmed resistive state is designed to be persistent in non-volatile memory. For example, once configured in a resistive state, the material stays in such resistive state even if neither a current nor a voltage is applied to the material. Further, the configuration of the material may be repeatedly changed from one resistance state to another for programming the memory cell into different of at least two resistive states. Upon such programming, the resistive state of the material can be determined by appropriate signals applied to one or both of the two electrodes between which the material is received.

Certain metal oxides can be used as such materials in resistive memory cells. During fabrication, the materials which make up the memory elements are deposited and patterned to produce a desired finish shape and construction of the individual memory cells in an array of such cells. Accordingly, a conductive material is deposited for one of the electrodes, followed by deposition of at least some metal oxide for the programmable region, and followed by deposition of more conductive material for the other electrode of the memory cell. Often, the first and second conductive layers are fabricated as elongated conductive lines which run generally parallel an outermost major surface of the substrate upon which such are fabricated, yet orthogonal relative to one another.

Regardless, the three different regions of the memory cell are often patterned by etching using multiple masking and etching steps. Such typically include anisotropic plasma etching through the conductive outer electrode material inwardly at least to the metal oxide which will be the programmable region of the memory cell. Further, usually subsequent plasma etching is conducted through the metal oxide to the lower electrode conductive material. Regardless, exposure of the metal oxide material to plasma etching can adversely affect the operation of the memory cell in that composition and/or structure of the metal oxide material may be modified in an unpredictable manner.

BRIEF DESCRIPTION OF THE DRAWINGS

FIG. 1 is a diagrammatic perspective view of a semiconductor substrate fragment in process in accordance with an embodiment of the invention.

FIG. 2 is a view of the FIG. 1 substrate fragment, with the front face of such being taken through taken in a plane bearing lines X-X and Z-Z in FIG. 1.

FIG. 3 is a view of the FIG. 1 substrate at a processing step subsequent to that shown by FIG. 1.

FIG. 4 is a view of the FIG. 2 substrate at a processing step corresponding in sequence to that of FIG. 3.

FIG. 5 is a view of the FIG. 3 substrate at a processing step subsequent to that shown by FIG. 3.

FIG. 6 is a view of the FIG. 4 substrate at a processing step corresponding in sequence to that of FIG. 5.

FIG. 7 is a view of the FIG. 5 substrate at a processing step subsequent to that shown by FIG. 5.

FIG. 8 is a view of the FIG. 6 substrate at a processing step corresponding in sequence to that of FIG. 7.

FIG. 9 is a view of the FIG. 7 substrate at a processing step subsequent to that shown by FIG. 7.

FIG. 10 is a view of the FIG. 8 substrate at a processing step corresponding in sequence to that of FIG. 9.

FIG. 11 is a diagrammatic perspective view of an alternate semiconductor substrate fragment in process in accordance with an embodiment of the invention.

FIG. 12 is a view of the FIG. 11 substrate fragment, with the front face of such being taken through taken in a plane bearing lines X-X and Z-Z in FIG. 11.

FIG. 13 is a view of the FIG. 11 substrate at a processing step subsequent to that shown by FIG. 11.

FIG. 14 is a view of the FIG. 12 substrate at a processing step corresponding in sequence to that of FIG. 13.

FIG. 15 is a view of the FIG. 13 substrate at a processing step subsequent to that shown by FIG. 13.

FIG. 16 is a view of the FIG. 14 substrate at a processing step corresponding in sequence to that of FIG. 15.

FIG. 17 is a view of the FIG. 15 substrate at a processing step subsequent to that shown by FIG. 15.

FIG. 18 is a view of the FIG. 16 substrate at a processing step corresponding in sequence to that of FIG. 17.

FIG. 19 is a view of the FIG. 17 substrate at a processing step subsequent to that shown by FIG. 17.

FIG. 20 is a view of the FIG. 18 substrate at a processing step corresponding in sequence to that of FIG. 19.

FIG. 21 is a view of the FIG. 19 substrate at a processing step subsequent to that shown by FIG. 19.

FIG. 22 is a view of the FIG. 20 substrate at a processing step corresponding in sequence to that of FIG. 21.

DETAILED DESCRIPTION OF EXAMPLE EMBODIMENTS

Example embodiments of the invention are initially described with reference to FIGS. 1-10. Referring initially to FIGS. 1 and 2, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. FIGS. 1 and 2 are depicted in block-like perspective view which would each be fragments of a larger substrate. Multiple different materials and layers would be present at least below the depicted block fragments, and may for example comprise bulk semiconductor processing, semiconductor-on-insulator processing, or other substrates in process whether existing or yet-to-be developed.

FIG. 2 is depicted as comprising a front face cross section which has been taken through lines X-X and Z-Z in FIG. 1. FIGS. 1 and 2 comprise what will be a first conductive electrode 12 as part of substrate 10 of the memory cell which will be fabricated. Line Z-Z is centered over and between the lateral edges of first conductive electrode 12. Any alternate construction or configuration first conductive electrode is of course also contemplated. Nevertheless, embodiments of the invention contemplate fabrication of a plurality of non-volatile resistive oxide memory cells within a memory array, thereby for example perhaps millions of such individual memory cells being fabricated at essentially the same time. FIG. 1 depicts another repeating electrode 13 for another memory cell.

In certain aspects, embodiments of the invention include a non-volatile resistive oxide memory array as well as methods of fabricating a non-volatile resistive oxide memory array. Such methods are not limited by the structure, and such structure is not limited by the methods unless literally limiting language appears in a claim under analysis.

In some embodiments, a memory array will comprise a plurality of memory cells as part of a semiconductor substrate, with the memory cells comprising a series of conductive word lines and a series of conductive bit lines which are angled relative to one another and form individual memory cells from such plurality where the respective word lines and respective bit lines cross one another. In one embodiment, a method of forming a non-volatile resistive oxide memory array includes forming a plurality of one of conductive word lines or conductive bit lines over a substrate. In one embodiment and with reference to FIG. 1, the depicted example conductive lines 12 and 13 together comprise example conductive word lines or example conductive bit lines formed over substrate 10. Such may be comprised of one or more conductive materials and/or layers, including conductively doped semiconductive material.

Insulative material 14 has been deposited over first electrode 12, and accordingly in one embodiment over the one of the word lines or bit lines represented by conductive lines 12 and 13. Insulative material 14 may be homogenous or non-homogenous and comprise one or multiple different layers. Doped silicon dioxides such as borophosphosilicate glass (BPSG), phosphosilicate glass (PSG), borosilicate glass (BSG), and undoped silicon dioxide are examples.

For purpose of the continuing discussion and in some example embodiments, insulative material 14 can be considered as having an outermost surface 16. Such is depicted as being planar, for example conducting a planarizing process to material 14 after its deposition, although such might be other than planar. Regardless in one embodiment, substrate 10 can be considered as having some outer major surface of the substrate which may or may not be planar now or at any time during fabrication. Regardless, substrate 10 at its largest or global scale can be considered as having some outer major surface that can be considered on average as defining some general horizontal plane relative to which the various layers and circuitry components are fabricated. At the point of the FIGS. 1 and 2 processing, such can be considered as defined by a plane containing lines S-S and T-T which, by way of example only, is shown as being perfectly planar and coincident with the outer surface defined by insulative material 14. However, such may or may not be planar, and the outer major surface of the substrate may of course be comprised of more than one composition at different points in processing of the substrate. Accordingly, the outer major surface of the substrate can be considered as averaging to be planar relative to the plane defined by S-S and T-T throughout fabrication, with such general plane rising and lowering as the circuitry is fabricated. In accordance with one embodiment of a method of forming a non-volatile resistive oxide memory cell, first conductive electrode 12 comprises a conductive line which runs generally parallel the outermost major surface of the substrate.

Referring to FIGS. 3 and 4, an elongated trench 18 has been formed into insulative material 14 over first conductive electrode 12. In one embodiment, a series of elongated trenches have been formed into insulative material 14 over the one of word lines 12, 13 or bit lines 12, 13, with two of such trenches being shown and indicated with reference numerals 18 and 19. In one embodiment, such trenches run generally parallel the outer major surface of the substrate. In one embodiment, trenches 18 and 19 are angled relative to the one of word lines 12, 13 or bit lines 12, 13. In the depicted embodiment, trenches 18 and 19 are angled generally perpendicularly relative to the one of word lines 12, 13 or bit lines 12, 13. Other angles are of course contemplated, and word lines 12, 13 or bit lines 12, 13 may run in respective straight lines within the memory array which is fabricated, or may be configured in other than straight lines. For example, the memory array might be fabricated such that the bit lines and word lines serpentine relative to one another in different straight line or curved-line segments throughout the array.

Focus of the continuing discussion for ease of description will be primarily relative to fabrication of a single memory cell with respect to trench 18. Further for purpose of the continuing discussion, trench 18 can be considered as comprising sidewalls 20 and 22, and a base 24. In the depicted example FIGS. 3 and 4 embodiment, base 24 is continuous and substantially planar and extends elevationally inward to expose first conductive electrode 12. Such likewise exists with respect to trench 19, but are not so designated towards maintaining clarity in the block perspective figures. Regardless, in one embodiment, the trench bases are formed to extend elevationally inward to the one of the word lines or bit lines, for example as shown. Regardless and even more broadly considered, an opening 18 has been formed into insulative material 14 over first electrode 12, with such opening in the example embodiment extending completely to first electrode 12. Opening 18 in one embodiment and as shown, comprises an elongated trench in insulative material 14 that runs generally parallel an outer major surface of substrate 10. Alternate configuration openings are also of course contemplated.

Referring to FIGS. 5 and 6, a multi-resistive state layer 28 comprising multi-resistive state metal oxide-comprising material has been deposited over outermost surface 16 of insulative material 14 and to within trench/opening 18 over opening sidewalls 20, 22 and over base 24 to less than fill opening/trench 18. Accordingly in one embodiment and as shown, the opening/trench sidewalls and base have been lined with a multi-resistive state layer 28. In the example embodiment, multi-resistive state layer 28 is depicted as being formed on first electrode 24, with "on" in this document defining some direct physical touching contact therewith. Regardless, layer 28 may be homogenous or non-homogenous, and may comprise one or more different compositions and/or layers. Accordingly, the material of layer 28 might be deposited/formed in more than one step. By ways of example only, such might comprise two different layers or regions generally regarded as or understood to be active or passive regions, although not necessarily. Example active cell region compositions which comprise metal oxide and can be configured in multi-resistive states include one or a combination of $Sr_xRu_yO_z$, $Ru_xO_y$, and $In_xSn_yO_z$. Other examples include $MgO$, $Ta_2O_5$, $SrTiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, multi-resistive state layer 28 might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187, 201, as well as in U.S. Patent Application Publication Nos. 2006/0171200 and 2007/0173019, the disclosures of which are hereby fully incorporated herein by reference for all purposes of this disclosure.

Referring to FIGS. 7 and 8, conductive material 30 has been formed over multi-resistive state layer 28 over outermost surface 16 of insulative material 14 and to within opening/trench 18 to overfill remaining volume of opening/trench 18. In the depicted example embodiment, conductive material 30 has been deposited to within trench/opening 18 laterally inward of multi-resistive state layer 28 which lines trench/opening sidewalls 20, 22, and elevationally over multi-resistive state layer 28 lining base 24. Conductive material 30 may be homogenous or non-homogenous, and regardless be of the same or different composition(s) from that of the conductive material of first electrode 12.

Referring to FIGS. 9 and 10, and in but one embodiment, conductive material 30 and multi-resistive state layer 28 have been removed at least to outermost surface 16 of insulative material 14. Such may occur by chemical mechanical polishing, etch, or by any other method whether existing or yet-to-be developed. A second conductive electrode 36 of the memory cell is formed which comprises the deposited conductive material 30 received within opening/trench 18 laterally inward of multi-resistive state layer 28 received over the opening/sidewalls and elevationally over the base of the opening/sidewalls. Accordingly FIGS. 9 and 10 by way of example only and for ease of illustration and description, depict an example memory cell 35 which comprises a first conductive electrode 12, a second conductive electrode 36 and a multi-resistive state layer/region 28 received therebetween. In the example embodiment, conductive material 30 received within trenches 18, 19 laterally inward of multi-resistive state layer 28 forms the other of said word lines or bit lines as designated by reference numerals 36, 37. Accordingly in such example, multi-resistive state metal oxide-comprising material of layer 28 received between the one of word lines 12, 13 or bit lines 12, 13 and the other of said word lines 36, 37 or bit lines 36, 37 form individually programmable junctions where the word lines and bit lines cross one another, for example as designated in conjunction with a memory cell 35 as constituting a single such junction in FIGS. 9 and 10.

Multi-resistive state metal oxide-comprising material in method and apparatus aspects as disclosed herein might constitute any existing or yet-to-be developed material. In some embodiments, all material which is formed between the first and second conductive electrodes is void of chalcogen other than oxygen. In some embodiments, all material formed between the first and second conductive electrodes is void of polymer. In some embodiments, all material formed between the first and second electrodes consists essentially of a multi-resistive state layer.

Regardless, in one embodiment, a method of forming a non-volatile resistive oxide memory cell is void of exposing a multi-resistive state metal oxide-comprising material to any etching plasma. Alternately, such might be exposed to etching plasma. For example and by way of example only, the processing to produce the FIGS. 9 and 10 construction from that of FIGS. 7 and 8 might be conducted by polishing or other non-plasma etching. Alternately, plasma etching might be utilized to produce the FIGS. 9 and 10 construction. Regardless, FIGS. 9 and 10 depict an example embodiment wherein an uppermost surface 38 of multi-resistive state layer 28 is elevationally coincident with an uppermost surface 40 of deposited conductive material 30 in a finished integrated circuitry construction incorporating the memory cell. Further in the depicted embodiment, uppermost surfaces 38 and 40 are also elevationally coincident with the uppermost surface of insulative material 14 within which trench/opening 18 is formed. Such may or may not be surface 16 in the finished integrated circuitry construction depending upon the degree inwardly to which materials 14, 28, and 30 are polished/removed.

An embodiment of the invention encompasses a non-volatile resistive oxide memory cell independent of method of fabrication. By way of example only, FIGS. 9 and 10 depict an example such memory cell 35. Such comprises a first conductive electrode 12 comprising opposing sidewalls 41, 43 in a first cross section, for example the cross section bearing lines X-X and Z-Z in FIG. 10. Memory cell 35 comprises a second conductive electrode 36 comprising opposing sidewalls 45, 47 in a second cross section which intersects the first cross section, for example the cross section depicted in FIG. 9 by the front face of substrate block 10 and in which line Z-Z is received. A multi-resistive state layer 28 comprising multi-resistive state metal oxide-comprising material is received between first conductive electrode 12 and second conductive electrode 36. The multi-resistive state metal oxide-comprising material of the layer extends to be received over at least a portion of at least one of the opposing sidewalls of at least one of the first and second electrodes. In one such embodiment, the multi-resistive state metal oxide-comprising material of the layer is received over all of the at least one of the opposing sidewalls of at least one of the first and second electrodes. In one embodiment, the multi-resistive state metal oxide-comprising material of the layer is received over at least a portion of both of the opposing sidewalls of at least one of the first and second electrodes.

For example with respect to the FIGS. 9 and 10 embodiment, multi-resistive state metal oxide-comprising material of layer 28 extends to be received over all of each of opposing sidewalls 45, 47 of second electrode 36. Alternately by way of example only, layer 28 might extend to be received over only a portion (not shown) of one or both of second electrode sidewalls 45, 47. Further by way of example only, multi-resistive state metal oxide-comprising material 28 might additionally or alternatively also be received over at least a portion or all of opposing sidewalls 41, 43 (not shown) of first electrode 12. In one embodiment and as shown, multi-resistive state metal oxide-comprising material of the layer is received over as least a portion of the opposing sidewalls of only one of the first and second electrodes, with FIGS. 9 and 10 depicting such with respect to second electrode 36.

An embodiment of the invention encompasses a non-volatile resistive oxide memory array. Such comprises a plurality of memory cells as part of a semiconductor substrate. The plurality of memory cells comprises a series of word lines and bit lines which are angled relative to one another and form individual memory cells of the plurality where the respective word lines and respective bit lines cross one another. The individual memory cells comprise a multi-resistive state metal oxide-comprising material received between the crossing word lines and bit lines. Any of the above constructions and methods of forming such are but example constructions and methods to form such an example in accordance with this embodiment. At least one of the series of word lines and series of bit lines comprises respective sidewalls that are covered with multi-resistive state metal oxide-comprising material. In one example embodiment, only one of said series of word lines and bit lines has its respective sidewalls covered with the multi-resistive state metal oxide-comprising material. Alternate embodiments and implementations are also of course contemplated.

Alternate example embodiment methods and constructions are next described with reference to FIGS. 11-22 with respect to a substrate fragment 10a. Like numerals from the first described embodiments are utilized where appropriate, with differences being indicated with the suffix "a" or with different numerals. Referring to FIGS. 11 and 12, insulative material 14a comprises an inner region or layer 50, an intermediate region or layer 51, and an outer region or layer 52. Material of region/layer 51 in one embodiment is etchably different from that of layers/regions 50 and 52. Regions 50 and 52 may be of the same or different composition(s). In one example, regions 50 and 52 comprise doped silicon dioxide such as BPSG, BSG, or PSG, and region 51 comprises silicon nitride.

Referring to FIGS. 13 and 14, openings/elongated trenches 18a, 19a have been formed into insulative material 14a and run generally parallel an outer major surface of the substrate, with such openings/trenches being received over first conductive electrodes 12, 13. Such defines opening/trench sidewalls 20a, 22a, and bases 24a. In the depicted example, layer 51 has been utilized as an etch stop for the etching of trenches 18a, 19a, with a suitable anisotropic etching chemistry having been selected to selectively etch material 52 selectively relative to material 51 to provide a suitable etch stopping function. Alternate suitable etching chemistry and conditions might be selected to achieve such etching with or without an etch stopping layer, for example etching for a selected period of time with or without the presence of layer 51.

Referring to FIGS. 15 and 16, and after forming openings/trenches 18a, 19a, vias 60, 61 have been formed into insulative material 14a (i.e. materials 51 and 50 thereof) through trench bases 24a over first conductive electrode 12. Corresponding vias would of course also likely be made over electrode line 13 and other electrode lines that may be formed within an array of such memory cells. Vias 60, 61 are shown as comprising respective sidewalls 62, 63 and 64, and a base 65. In one aspect and in accordance with the above described embodiments, an example trench 18a and via 60 may collectively be considered as an opening which has been formed into insulative material 14a over a first electrode 12. In the just-described embodiment, via 60 was etched after the etch to form trench 18a. However of course, such processing could be reversed whereby via opening 60 is etched through insulative material 14a followed by etching of trench 18a.

Referring to FIGS. 17 and 18, trench sidewalls 20a, 22b, base 24b, via sidewalls 62, 63, 64, and via base 65 have been lined with a multi-resistive state layer 28a comprising multi-resistive state metal oxide-comprising material which less than fills trench 18a and via 60. Example materials and constructions can of course be as described above in connection with the first described embodiments.

Referring to FIGS. 19 and 20, conductive material 30a has been formed within via 60 and trench 18a over multi-resistive state layer 28a received over the sidewalls and base of via 60 and over the sidewalls and base of trench 18a.

Referring to FIGS. 21 and 22, and in but one embodiment, conductive material 30a and multi-resistive state layer 28a have been removed at least to the outermost surface 16 of insulative material 14a. A second conductive electrode 75 of a memory cell 35a is formed from conductive material 30a received within via 60 laterally inward of multi-resistive state layer 28a received over via sidewalls 62, 63, 64 (designated in FIGS. 15, 16) and received elevationally over via base 65 (designated in FIGS. 15, 16). Conductive material 30a comprises a conductive line 77 running generally parallel the outermost major surface of the substrate within trench 18a.

The embodiments of FIGS. 11-22 might be considered as dual damascene-like processing, whereas the embodiments of FIGS. 1-10 might be considered as single damascene-like processing. Third or higher damascene-like processing might also be conducted, or no damascene-like processing conducted.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a non-volatile resistive oxide memory cell, comprising:
    forming a first conductive electrode of the memory cell as part of a substrate;
    depositing insulative material over the first electrode;
    forming an opening into the insulative material over the first electrode, the opening comprising sidewalls and a base, the opening comprising an elongated trench in the insulative material having a via extending therefrom to the first conductive electrode;
    lining the opening sidewalls and base with a multi-resistive state layer comprising multi-resistive state metal oxide-comprising material which less than fills the opening; and
    forming a second conductive electrode of the memory cell within the opening laterally inward of the multi-resistive state layer lining the sidewalls and elevationally over the multi-resistive state layer lining the base.

2. The method of claim 1 wherein the opening is formed to the first electrode.

3. The method of claim 2 wherein the multi-resistive state layer is formed on the first electrode.

4. The method of claim 1 wherein all material formed between the first and second conductive electrodes is void of chalcogen other than oxygen.

5. The method of claim 1 wherein all material formed between the first and second conductive electrodes is void of polymer.

6. The method of claim 1 wherein all material formed between the first and second electrodes consists essentially of said multi-resistive state layer.

7. The method of claim 1 being void of exposing said multi-resistive state metal oxide-comprising material to any etching plasma.

8. A method of forming a non-volatile resistive oxide memory cell, comprising:
    forming a first conductive electrode of the memory cell as part of a substrate;
    depositing insulative material over the first electrode, the insulative material having an outermost surface;
    forming an opening into the insulative material over the first electrode, the opening comprising sidewalls and a base, the opening comprising an elongated trench in the insulative material that runs generally parallel an outer major surface of the substrate, the opening comprising a via extending from the elongated trench to the first conductive electrode;
    depositing a multi-resistive state layer comprising multi-resistive state metal oxide-comprising material over the outermost surface and to within the opening over the opening sidewalls and base to less than fill the opening;
    depositing conductive material over the multi-resistive state layer received over the outermost surface and to within the opening to overfill remaining volume of the opening; and
    removing the conductive material and the multi-resistive state layer at least to the outermost surface of the insulative material and forming a second conductive electrode of the memory cell which comprises the deposited conductive material received within the opening laterally inward of the multi-resistive state layer received over the opening sidewalls and received elevationally over the base.

9. The method of claim 8 comprising forming an uppermost surface of said deposited multi-resistive state layer to be elevationally coincident with an uppermost surface of said deposited conductive material in a finished integrated circuitry construction incorporating said memory cell.

10. The method of claim 8 comprising forming the via after forming the trench.

11. The method of claim 8 comprising forming an uppermost surface of said multi-resistive state layer, an uppermost surface of said conductive material, and an uppermost surface of said insulative material within which the elongated trench is formed to collectively be elevationally coincident in a finished integrated circuitry construction incorporating said memory cell.

12. A method of forming a non-volatile resistive oxide memory cell, comprising:
    forming a first conductive electrode of the memory cell as part of a substrate;
    depositing insulative material over the first electrode;
    forming an elongated trench into the insulative material that runs generally parallel an outer major surface of the substrate, the trench being received over the first conductive electrode, the trench comprising sidewalls and a base;
    after forming the elongated trench, forming a via into the insulative material through the trench base over the first conductive electrode, the via comprising sidewalls and a base;
    lining the trench sidewalls and base and the via sidewalls and base with a multi-resistive state layer comprising multi-resistive state metal oxide-comprising material which less than fills the trench and the via; and
    forming conductive material within the via and within the trench over the multi-resistive state layer received over the sidewalls and base of the via and over the sidewalls and base of the trench, the conductive material comprising a second conductive electrode of the memory cell received within the via laterally inward of the multi-resistive state layer received over the via sidewalls and received elevationally over the via base, the conductive material comprising a conductive line running generally parallel the outermost major surface of the substrate within the trench.

13. The method of claim 12 wherein the first conductive electrode comprises a conductive line running generally parallel the outermost major surface of the substrate and generally perpendicular the conductive line of said conductive material within the elongated trench.

14. A method of forming a non-volatile resistive oxide memory array, comprising,
    forming a plurality of one of conductive word lines or conductive bit lines over a substrate;
    depositing insulative material over the plurality of said one of the word lines or bit lines;
    forming a series of elongated trenches into the insulative material over the plurality of said one of the word lines or bit lines, the trenches running generally parallel an outer major surface of the substrate, the trenches being angled relative to the plurality of said one of the word lines or bit lines, the trenches respectively comprising sidewalls and a base, forming the trench bases to be received elevationally outward of said one of the word lines or bit lines, and further comprising forming vias extending from the trench bases to the respective ones of the word lines or bit lines;
    lining the respective trenches sidewalls with a multi-resistive state layer comprising multi-resistive state metal oxide-comprising material which less than fills the respective trenches;
    depositing conductive material over the substrate and to within the trenches laterally inward of the multi-resistive state layer lining the trench sidewalls, the deposited conductive material received within the trenches laterally inward of the multi-resistive state layer lining the trench sidewalls comprising a plurality of the other of conductive word lines or conductive bit lines; and
    providing said multi-resistive state metal oxide-comprising material between said one of the word lines or bit lines and said other of the word lines or bit lines to form individually programmable junctions where the word lines and bit lines cross one another.

15. The method of claim 14 wherein the trenches are angled generally perpendicular relative to the one of the word lines or bit lines.

16. The method of claim 14 wherein the word lines and bit lines run in respective straight lines within the array.

17. The method of claim 16 wherein the trenches are angled generally perpendicular relative to said one of the word lines or bit lines.

* * * * *